(12) United States Patent
Hara et al.

(10) Patent No.: US 8,648,670 B2
(45) Date of Patent: Feb. 11, 2014

(54) FILTER, DUPLEXER AND COMMUNICATION MODULE

(75) Inventors: Motoaki Hara, Kawasaki (JP); Shogo Inoue, Kawasaki (JP); Masafumi Iwaki, Kawasaki (JP); Jun Tsutsumi, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 266 days.

(21) Appl. No.: 12/582,032

(22) Filed: Oct. 20, 2009

(65) Prior Publication Data
US 2010/0188166 A1 Jul. 29, 2010

(30) Foreign Application Priority Data
Jan. 27, 2009 (JP) ................................ 2009-015477

(51) Int. Cl.
*H03H 9/70* (2006.01)
*H03H 9/72* (2006.01)
*H03H 9/54* (2006.01)
*H03H 9/64* (2006.01)

(52) U.S. Cl.
USPC ............ 333/133; 333/189; 333/193; 333/195

(58) Field of Classification Search
USPC ........... 333/189–196, 133; 310/313 B, 313 D
See application file for complete search history.

(56) References Cited

U.S. PATENT DOCUMENTS

| | | | |
|---|---|---|---|
| 5,847,626 A | 12/1998 | Taguchi et al. | |
| 5,999,069 A * | 12/1999 | Ushiroku | 333/193 |
| RE37,375 E | 9/2001 | Satoh et al. | |
| 6,462,631 B2 * | 10/2002 | Bradley et al. | 333/189 |
| 6,819,203 B2 * | 11/2004 | Taniguchi | 333/193 |
| 6,844,795 B2 | 1/2005 | Inose | |
| 6,919,777 B2 * | 7/2005 | Taniguchi et al. | 333/133 |
| 6,949,990 B2 * | 9/2005 | Nishihara et al. | 333/189 |
| 7,126,253 B2 * | 10/2006 | Unterberger | 333/189 |
| 7,145,417 B2 | 12/2006 | Kimachi et al. | |
| 7,301,420 B2 * | 11/2007 | Yamaguchi et al. | 333/133 |
| 7,489,063 B2 * | 2/2009 | Isobe et al. | 310/312 |

(Continued)

FOREIGN PATENT DOCUMENTS

| | | |
|---|---|---|
| CN | 1913348 A | 2/2007 |
| CN | 1921303 A | 2/2007 |

(Continued)

OTHER PUBLICATIONS

Jong-Seok Kim et al., "RF MEMS for innovation of wireless telecommunication device" World of Electricity, Oct. 2006, pp. 36-41, vol. 55, No. 10, The Korean Institute of Electrical Engineers, Soul, South Korea.

(Continued)

*Primary Examiner* — Barbara Summons
(74) *Attorney, Agent, or Firm* — Chen Yoshimura LLP

(57) ABSTRACT

According to an aspect of the invention, each of a filter, a duplexer and a communication module includes a plurality of series resonators connected to a signal line in series and a plurality of parallel resonators connected to the signal line in parallel. At least two of the plurality of parallel resonators are connected to the signal line between two of the plurality of series resonators in parallel, inductors are respectively connected to the at least two parallel resonators, and the inductors have different inductances from each other.

11 Claims, 21 Drawing Sheets

(56) References Cited

U.S. PATENT DOCUMENTS

| | | |
|---|---|---|
| 7,830,226 B2 * | 11/2010 | Nam et al. .................... 333/133 |
| 2001/0011932 A1 | 8/2001 | Takamiya et al. |
| 2003/0186673 A1 | 10/2003 | Kimachi et al. |
| 2003/0227358 A1 | 12/2003 | Inose |
| 2005/0070332 A1 | 3/2005 | Yamato |
| 2007/0030096 A1 | 2/2007 | Nishihara et al. |
| 2007/0046395 A1 * | 3/2007 | Tsutsumi et al. ............. 333/133 |
| 2007/0111674 A1 | 5/2007 | Iwamoto et al. |
| 2008/0197941 A1 | 8/2008 | Suzuki et al. |
| 2009/0096551 A1 | 4/2009 | Yamagata |
| 2012/0098624 A1 | 4/2012 | Link |

FOREIGN PATENT DOCUMENTS

| | | | |
|---|---|---|---|
| JP | 05-183380 A | | 7/1993 |
| JP | 09-289434 A | | 11/1997 |
| JP | 11-55067 | * | 2/1999 |
| JP | 2001-298348 A | | 10/2001 |
| JP | 2002-290204 | * | 10/2002 |
| JP | 2003-298392 A | | 10/2003 |
| JP | 2004-7250 | * | 1/2004 |
| JP | 2004-015397 A | | 1/2004 |
| JP | 2004-112277 A | | 4/2004 |
| JP | 2005-124139 A | | 5/2005 |
| JP | 2007-060411 A | | 3/2007 |
| JP | 2007-142560 A | | 6/2007 |
| JP | 2008-205947 | | 9/2008 |
| KR | 10-2003-0078773 A | | 10/2003 |
| WO | 2007/114390 A1 | | 10/2007 |

OTHER PUBLICATIONS

Japanese Office Action dated Sep. 4, 2012, in a counterpart Japanese patent application No. 2009-015477.
Chinese Office Action dated Mar. 1, 2013, in a counterpart Chinese patent application No. 200910207091.5.
Chinese Office Action dated Sep. 17, 2013, in a counterpart Chinese patent application No. 200910207091.5.
Japanese Office Action dated Dec. 3, 2013, in a counterpart Japanese patent application No. 2013-031288.

* cited by examiner

FILTER, DUPLEXER AND COMMUNICATION MODULE

CROSS-REFERENCE TO RELATED APPLICATION

This application is based upon and claims the benefit of priority of the prior Japanese Patent Application No. 2009-15477 filed on Jan. 27, 2009. The entire contents of which is incorporated herein by reference.

FIELD

The disclosure of the present application relates to a filter. The disclosure of the present invention relates to a duplexer and a communication module including the filter.

BACKGROUND

Due to a rapid proliferation of wireless devices represented by mobile phone terminals, demands for high-frequency filters have been increasing at a rapid pace. In particular, there are strong demands for small-size and highly precipitous acoustic wave filters.

As the sophistication of wireless systems has advanced at a rapid pace in recent years, specific demands for high-frequency filters have become highly complex. For example, it is preferable that a transmission filter and a reception filter included in a duplexer can achieve a low loss in a passband and high suppression in the opposite band (the band of a reception filer with respect to the band of a transmission filter, and vice versa).

Generally, filters incorporated in a mobile phone terminal or the like include, in many cases, a plurality of resonators that are connected to each other so as to ensure a broad passband. For example, Japanese Laid-open Patent Publication No. 2004-15397 discloses an example of a ladder filer.

However, with the above conventional configuration, when the number of stages in the ladder filter is increased to increase the number of attenuation poles in suppression bands, a loss in the passband also increases.

Further, with the configuration of connecting inductors to parallel resonators, it is difficult to place attenuation poles in frequency bands where suppression is most needed.

SUMMARY

According to an aspect of the invention, a filter includes a plurality of series resonators connected to a signal line in series and a plurality of parallel resonators connected to the signal line in parallel. At least two of the plurality of parallel resonators are connected to the signal line between two of the plurality of series resonators in parallel, inductors are respectively connected to the at least two parallel resonators, and the inductors have different inductances from each other.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF EMBODIMENT(S)

Figure 1A:
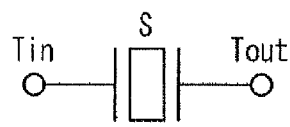
FIG. 1A is a circuit diagram in which a resonator S is connected to an input terminal $T_{in}$ and an output terminal $T_{out}$ in series.

In one embodiment of the invention, a filter includes a plurality of series resonators connected to a signal line in series and a plurality of parallel resonators connected to the signal line in parallel. At least two of the plurality of parallel resonators are connected to the signal line between two of the plurality of series resonators in parallel, inductors are respectively connected to the at least two parallel resonators, and the inductors have different inductances from each other.

The filter in one embodiment of the invention, having the basic structure as described above, can be configured as follows.

In one embodiment of the invention, the plurality of series resonators and the plurality of parallel resonators may be connected to each other in a ladder shape.

In one embodiment of the invention, the plurality of series resonators and the plurality of parallel resonators may be connected to each other in a lattice shape.

In one embodiment of the invention, the plurality of parallel resonators including the at least two parallel resonators to which the inductors having different inductances from each other are respectively connected may be grounded through one common inductor.

In one embodiment of the invention, the common inductor may be incorporated in a package or a printed wiring board.

In one embodiment of the invention, at least one of the series resonator and the parallel resonator is a surface acoustic wave element.

In one embodiment of the invention, at least one of the series resonator and the parallel resonator is a film bulk acoustic resonator.

In one embodiment of the invention, at least one of the series resonator and the parallel resonator is a bulk wave element.

According to an aspect of the invention, a duplexer includes a transmission filter and a reception filter. At least one of the transmission filter and the reception filter includes a plurality of series resonators connected to a signal line in series and a plurality of parallel resonators connected to the signal line in parallel, at least two of the plurality of parallel resonators are connected to the signal line between two of the plurality of series resonators in parallel, inductors are respectively connected to the at least two parallel resonators, and the inductors have different inductances from each other.

According to an aspect of the invention, a communication module includes a transmission filter and a reception filter. At least one of the transmission filter and the reception filter includes a plurality of series resonators connected to a signal line in series and a plurality of parallel resonators connected to the signal line in parallel, at least two parallel resonators are connected to the signal line between two of the plurality of series resonators in parallel, inductors are respectively connected to the at least two of the plurality of parallel resonators, and the inductors have different inductances from each other.

Embodiment

[1. Principles of Filter, etc.]

As described above, there are demands for filters to achieve a lower loss in a passband and higher suppression in a suppression band. Moreover, in recent years, high suppression of harmonics (a second harmonic, a third harmonic) in a passband is also demanded in some cases so as to avoid cross modulation. Further, in order to avoid interference with wireless systems such as a wireless LAN (Local Area Network) and Bluetooth (registered trademark), there are also demands for suppression in the frequency bands that are used by these wireless networks.

As a way to achieve high-frequency filters with low loss, ladder filters have been widely used. A ladder filter is a high-frequency filter formed by connecting two resonators having different resonance frequencies from each other in a ladder shape. The principles of the filter will be described with reference to FIGS. 1A to 1C.

Figure 1B:
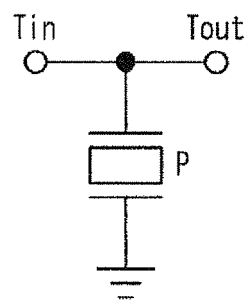
FIG. 1B is a circuit diagram in which a resonator P is connected between the input terminal $T_{in}$ and the output terminal $T_{out}$ in parallel.
Figure 1C:
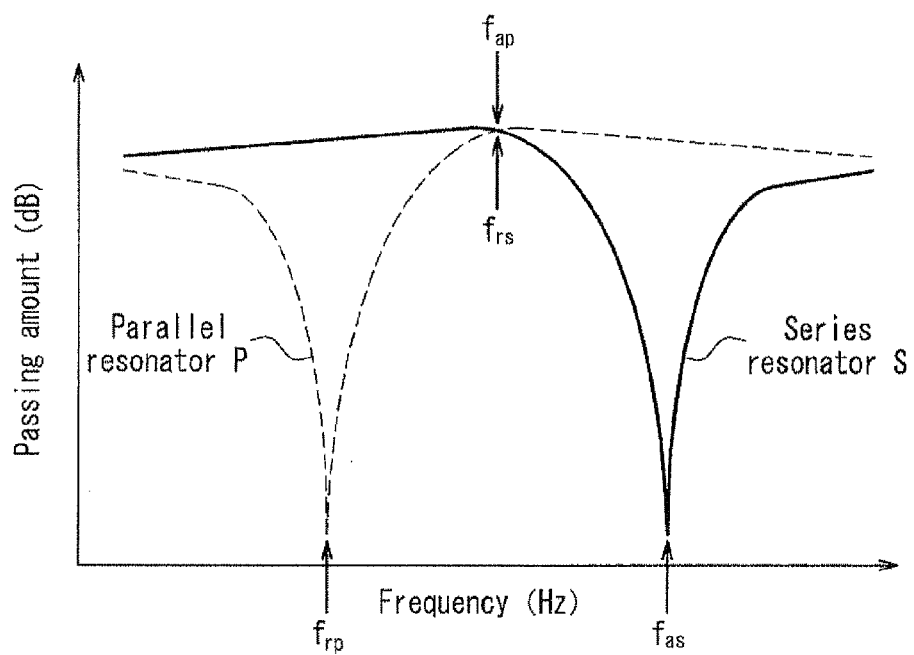
FIG. 1C is a graph illustrating the frequency characteristics of the resonators S and P.

FIG. 1A illustrates a circuit in which a resonator S is connected to an input terminal $T_{in}$ and an output terminal $T_{out}$ in series. FIG. 1B illustrates a circuit in which a resonator P is connected in parellel between the input terminal $T_{in}$ and the output terminal $T_{out}$. The resonator S depicted in FIG. 1A has a resonance frequency $f_{rs}$ and an antiresonance frequency $f_{as}$. The resonator P depicted in FIG. 1B has a resonance frequency $f_{rp}$ and an antiresonance frequency $f_{ap}$. FIG. 1C is a graph illustrating the resonance characteristics of the resonators S and P.

Figure 2A:
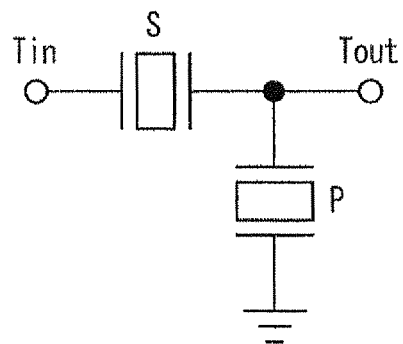
FIG. 2A is a circuit diagram in which the resonator S depicted in FIG. 1A is placed in the series arm and the resonator P depicted in FIG. 1B is placed in the parallel arm.
Figure 2B:
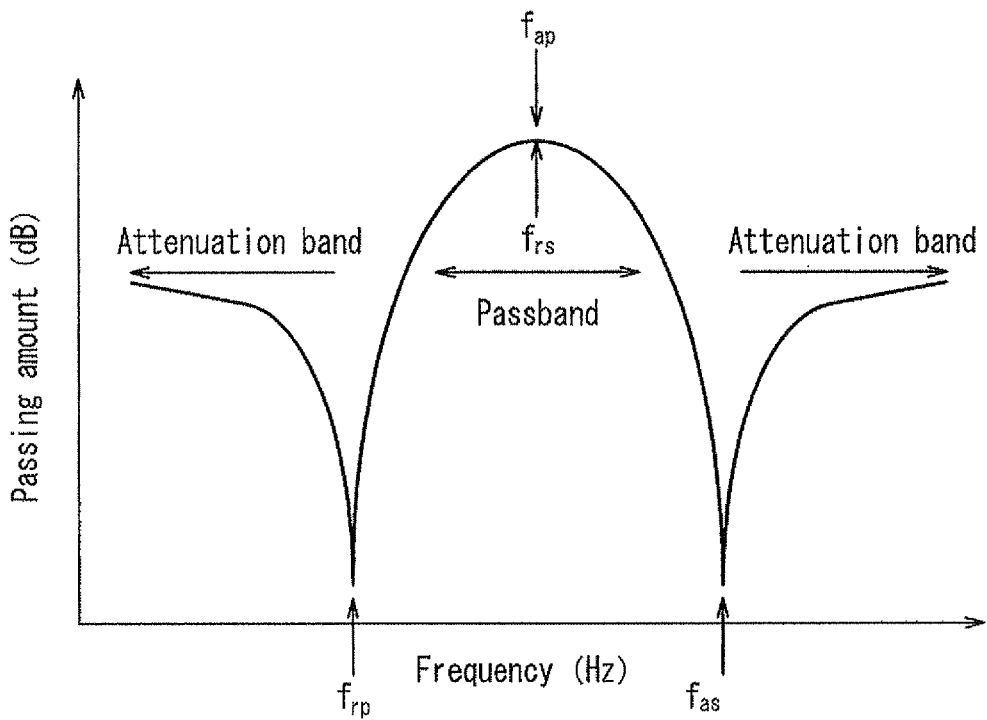
FIG. 2B is a graph illustrating the frequency characteristics of the filter depicted in FIG. 2A.

FIG. 2A is a circuit diagram illustrating a circuit in which the resonator S depicted in FIG. 1A is placed in the series arm and the resonator P depicted in FIG. 2B is placed in the parallel arm. When the antiresonance frequency $f_{ap}$ of the resonator P and the resonance frequency $f_{rs}$ of the resonator S in FIG. 2A are substantially equal to each other, the filer characteristics illustrated in FIG. 2B can be achieved. In other words, it is possible to achieve a bandpass filer with a passband that is between the resonance frequency $f_{rp}$ of the resonator P and the antiresonance frequency $f_{as}$ of the resonator S and an attenuation band that is lower than the resonance frequency $f_{rp}$ and higher than the antiresonance frequency $f_{as}$.

Generally, in filters incorporated in mobile phone terminals, a plurality of sets of the resonators depicted in FIG. 2A are connected to each other in many cases. Examples of a filter in which a plurality of resonators are connected to each other include a ladder filter in which a plurality of pairs of ladder circuits are connected to each other.

Figure 3A:
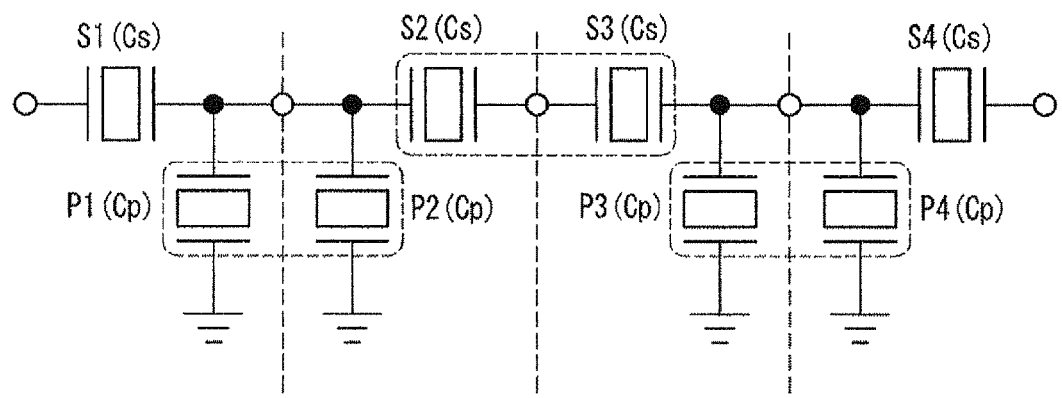
FIGS. 3A and 3B are circuit diagrams each illustrating the configuration of a ladder filter.

FIG. 3A illustrates an example of the ladder filter. In the ladder filter, when connecting a plurality of resonators to each other, the adjacent ladder circuits are mirror reversed from one another and are connected to each other in order to avoid a reflection among stages. Hereinafter, resonators connected to the series arm are referred to as series resonators and resonators connected to the parallel arm are referred to as parallel resonators.

Figure 3B:
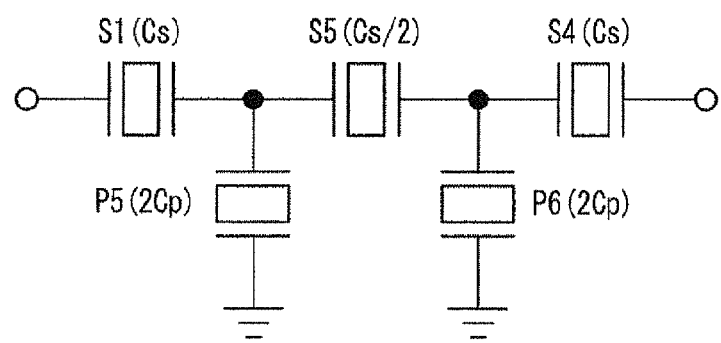

In a case where a plurality of resonators are connected to each other as in FIG. 3A, a portion in the series arm where similar series resonators are connected and portions in the parallel arm where similar parallel resonators are connected appear, the portions of which are enclosed by a dashed line. Since these similar resonators can be combined into a single resonator in terms of capacity as depicted in FIG. 3B, it is possible to reduce the chip size. It should be noted that Japanese Laid-open Patent Publication No. 2004-15397 discloses an example of the ladder filter depicted in FIG. 3B.

To achieve high suppression of harmonics (second harmonic, third harmonic) in a passband as described above, it has been proposed to connect inductors to parallel resonators. Since resonators function as a capacity in frequency bands outside the band in which they resonate, parallel resonators to which inductors are respectively connected function as LC resonators in frequency bands outside the band in which they resonate.

Figure 4A:
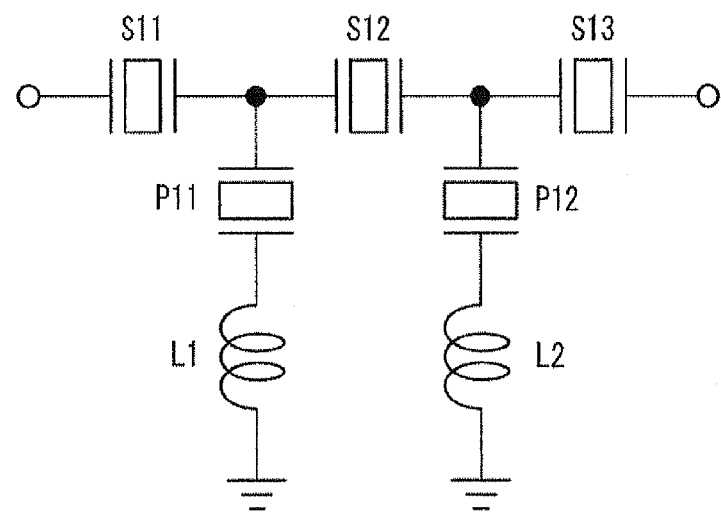
FIG. 4A is a circuit diagram illustrating a filter in which inductances are respectively connected to parallel resonators.
Figure 4B:
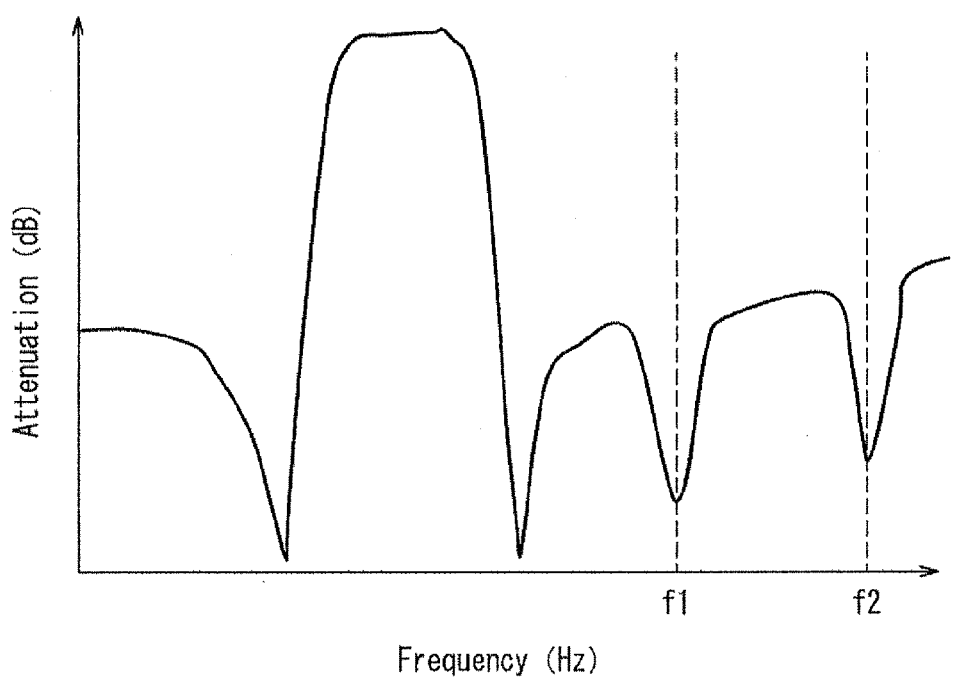
FIG. 4B is a graph illustrating the frequency characteristics of the filter depicted in FIG. 4A.

FIG. 4A is a diagram illustrating a filter in which inductors are connected to parallel resonators. When inductors L1 and L2 respectively having inductances H1 and H2 are connected to two parallel resonators P11 and P12 each having a capacity Cp, attenuation poles are respectively formed at frequencies f1 and f2 outside the passband, as can be seen from FIG. 4B. The frequencies f1 and f2 at which the attenuation poles are formed can be calculated on the basis of the following formulas. In the formulas, Cp denotes the capacity of each parallel resonator.

$f1=1/\{2\pi(H1 \cdot Cp)^{1/2}\}$ $f2=1/\{2\pi(H2 \cdot Cp)^{1/2}\}$

By adding more parallel resonators and connecting inductors respectively to the added parallel resonators in series, it is possible to increase the number of attenuation poles.

Figure 5A:
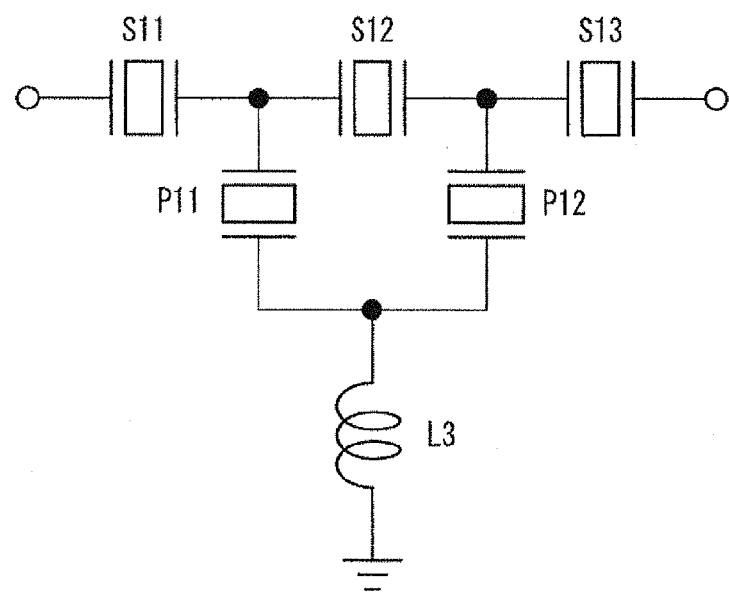
FIG. 5A is a circuit diagram illustrating a filter in which inductances are respectively connected to parallel resonators.
Figure 5B:
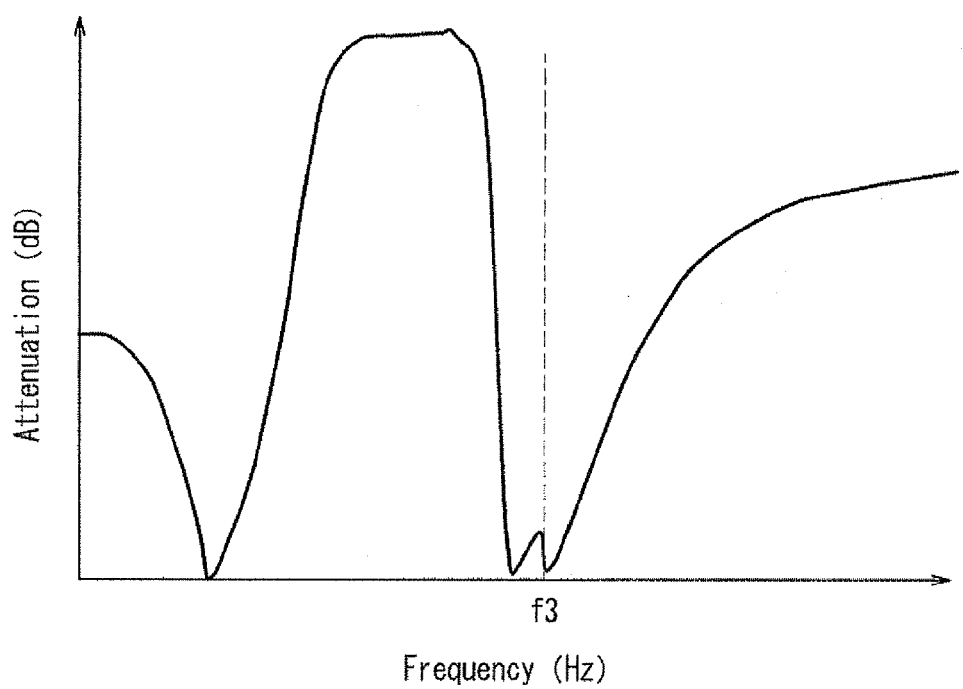
FIG. 5B is a graph illustrating the frequency characteristics of the filter depicted in FIG. 4A.

In contrast, when an inductor L3 is connected to the both parallel resonators P11 and P12 as depicted in FIG. 5A, an attenuation pole is generated at a frequency f3 outside the passband, as can be seen from FIG. 5B.

Figure 6A:
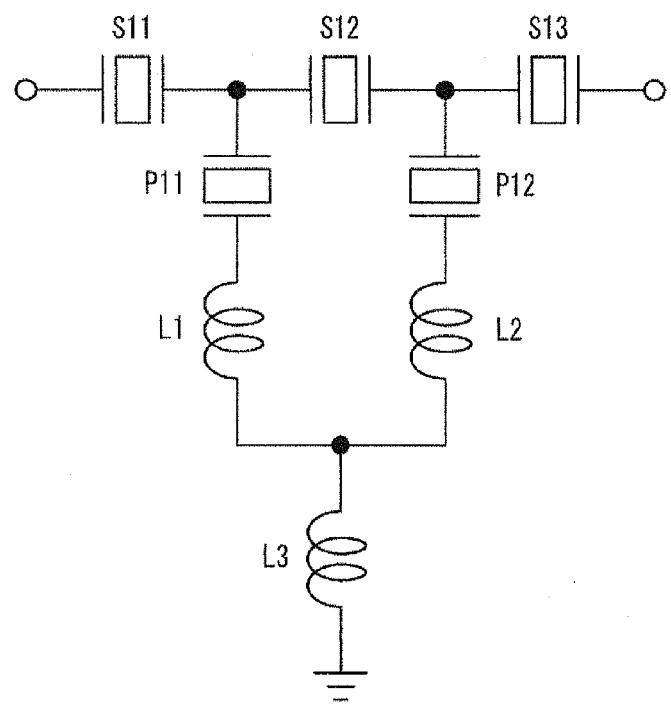
FIGS. 6A to 6C are circuit diagrams each illustrating a modified example of a conventional filter.
Figure 6B:
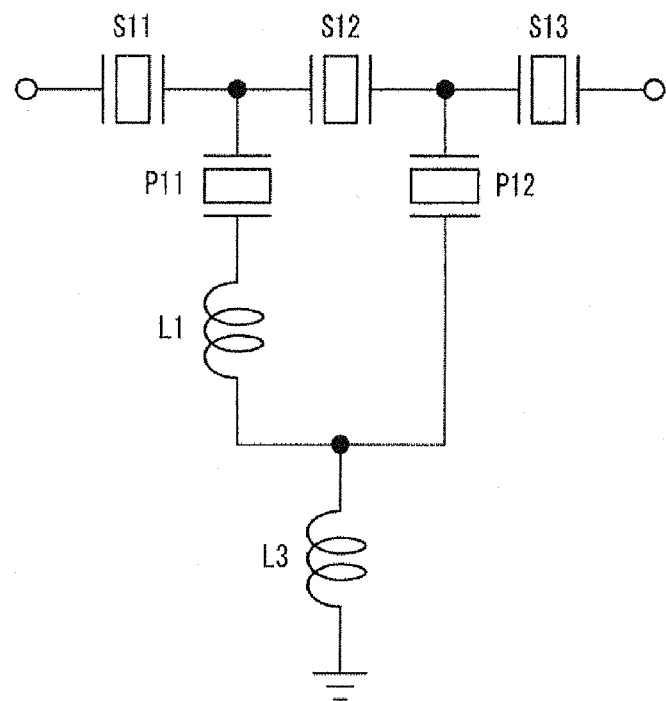
Figure 6C:
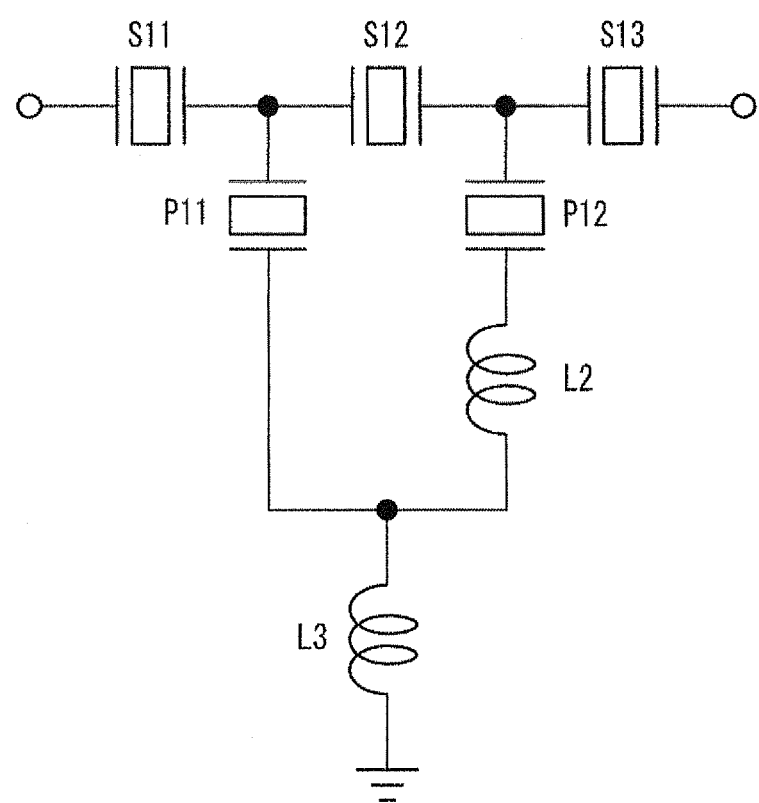

The filter depicted in FIG. 4A can be modified in several ways and examples thereof are respectively depicted in FIGS. 6A to 6C. In either case, two attenuation poles are generated in a high frequency band of the passband due to the inductors and the circuit of each example becomes equivalent to that in FIG. 4A.

Here, when the number of stages in the ladder filter is increased to increase the number of the attenuation poles, a loss in the passband also increases. Further, with the configuration of connecting inductors to parallel resonators, it is difficult to place attenuation poles in the frequency bands where suppression is most needed.

Figure 7:
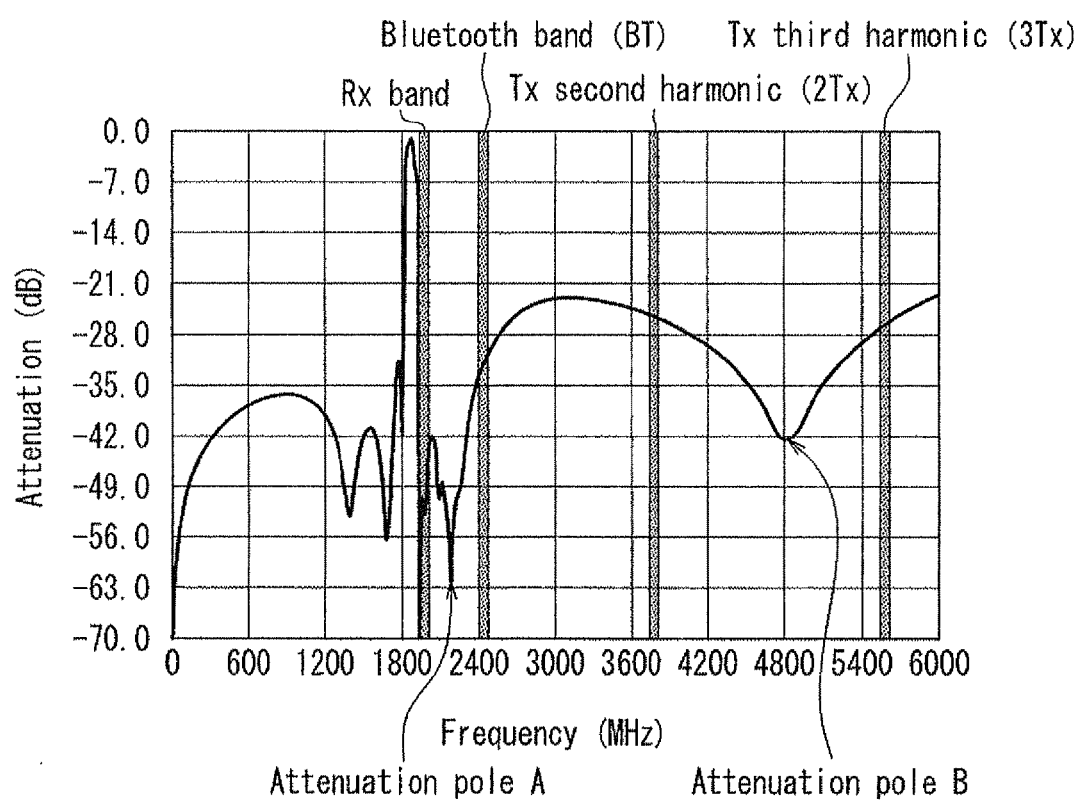
FIG. 7 is a graph illustrating the frequency characteristics of the filter depicted in FIG. 6A.

For example, FIG. 7 is a graph illustrating the frequency characteristics of the filter depicted in FIG. 6A. In the frequency characteristics of the filter depicted in FIG. 6A, two attenuation poles A and B generated in a high frequency band are respectively placed between an Rx band and the Bluetooth band (hereinafter referred to as the BT band) and between a Tx second harmonic and a Tx third harmonic. It is required that the attenuation poles A and B are placed in the frequency bands (the BT band, Tx second harmonic band and Tx third harmonic band) where suppression is most needed.

In the following embodiment, not only that attenuation poles can be placed at appropriate frequency positions in a high frequency band but also a filter with low loss can be provided.

[2. Configuration of Filter]

Figure 8:
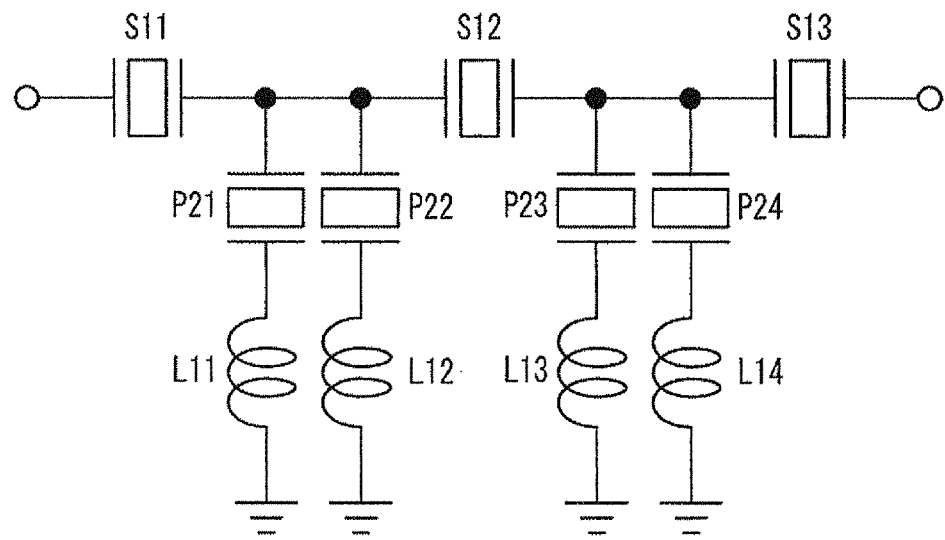
FIG. 8 is a circuit diagram illustrating a first configuration of a filter in one embodiment of the invention.

FIG. 8 is a circuit diagram illustrating a first configuration of the filter according to the present embodiment. In the filter depicted in FIG. 8, series resonators S11, S12 and S13 are connected to the series arm (signal line). Further, parallel resonators P21 and P22 are connected between the adjacent series resonators S11 and S12 in parallel with respect to the series arm (signal line). Further, parallel resonators P23 and P24 are connected between the adjacent series resonators S12 and S13 in parallel with respect to the series arm. Further, inductors L11, L12, L13 and L14 are connected to the parallel resonators P21, P22, P23 and P24, respectively. The inductors L11 to L14 have different inductances (values) from each other.

In the filter depicted in FIG. 8, the parallel resonators that were combined in one resonator are divided in parallel, and the inductors having different inductances from each other are connected to the respective parallel resonators. By configuring the circuit in this way, the number of attenuation poles can be increased without increasing the number of stages of the resonators. That is, although the number of stages of the resonators in the filter depicted in FIG. 8 is 4 similarly to the filter depicted in FIG. 4A, attenuation poles can be formed at four places (the number of places at which attenuation poles can be formed by the filter depicted in FIG. 4A is 2).

It should be noted that a pair of one series resonator and one parallel resonator forms one stage in the filter. For example, in the circuit depicted in FIG. 4A, the series resonator S11 and the parallel resonator P11, the series resonator S12 and the parallel resonator P11, the series resonator S13 and the parallel resonator P12 and the series resonator S14 and the parallel resonator P12 respectively form pairs, and a filter having four stages in total is achieved. In contrast, in the circuit depicted in FIG. 8, the series resonator S11 and the parallel resonator P21, the series resonator S12 and the parallel resonator P22, the series resonator S13 and the parallel resonator P23 and the series resonator S14 and the parallel resonator P24 respectively form pairs, and a filter having four stages in total is achieved.

Figure 9:
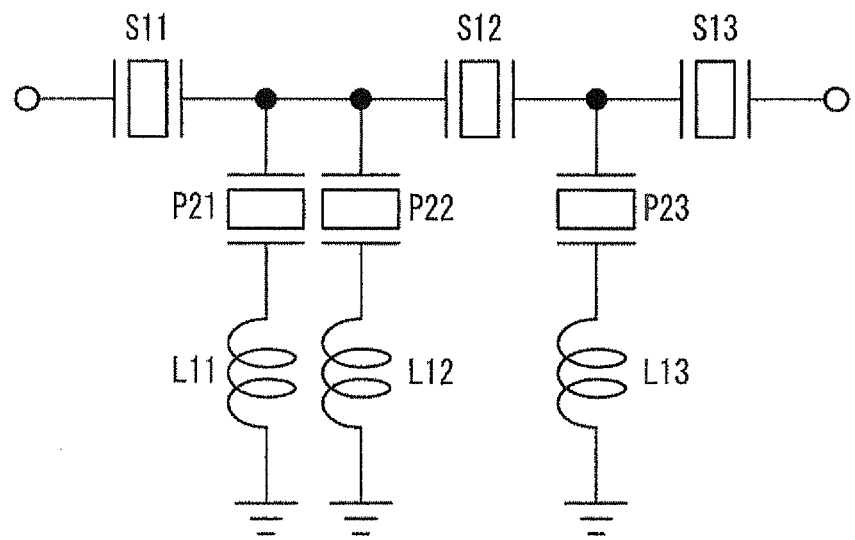
FIG. 9 is a circuit diagram illustrating a second configuration of the filter in one embodiment of the invention.

FIG. 9 is a circuit diagram illustrating a second configuration of the filter according to the present embodiment. In the filter depicted in FIG. 9, series resonators S11, S12, and S13 are connected to the series arm. Further, parallel resonators P21 and P22 are connected between the series resonators S11 and S12 in parallel with respect to the series arm. Furthermore, a parallel resonator 23 is connected between the series resonators S12 and S13 in parallel with respect to the series arm. Inductors L11, L12 and L13 are connected to the parallel resonators P21, P22 and P23, respectively. The inductors L11 to L13 have different inductances from each other.

In the filter depicted in FIG. 9, the parallel resonators that were integrated in one resonator are divided in parallel, and the inductors having different inductances from each other are connected to the respective parallel resonators. By configuring the circuit in this way, the number of attenuation poles can be increased without increasing the number of stages of the resonators. That is, although the number of stages of the resonators in the circuit depicted in FIG. 9 is 4 similarly to the filter illustrated in FIG. 4A, attenuation poles can be formed at three places (the number of places at which attenuation poles can be formed by the filter depicted in FIG. 4A is 2).

The filter according to the present embodiment can be used as a filter compatible with WCDMA Band II, for example. In WCDMA Band II, the number of attenuation poles required in a high frequency band is 3 (the BT band, the Tx second harmonic band and the Tx third harmonic band). Therefore, the filter depicted in FIG. 8 is compatible with WCDMA Band II. Further, even if one branch to which the parallel resonator and the inductor are connected is removed from the filter as depicted in FIG. 9, the filter is still compatible with WCDMA Band II.

Figure 10A:
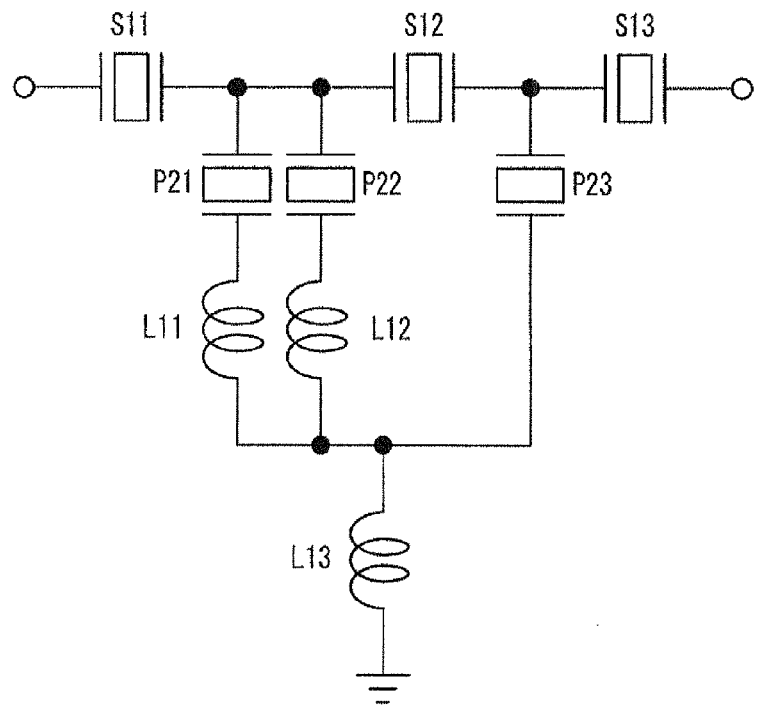
FIGS. 10A to 10C are circuit diagrams each illustrating a modified example of the filter in one embodiment of the invention.
Figure 10B:
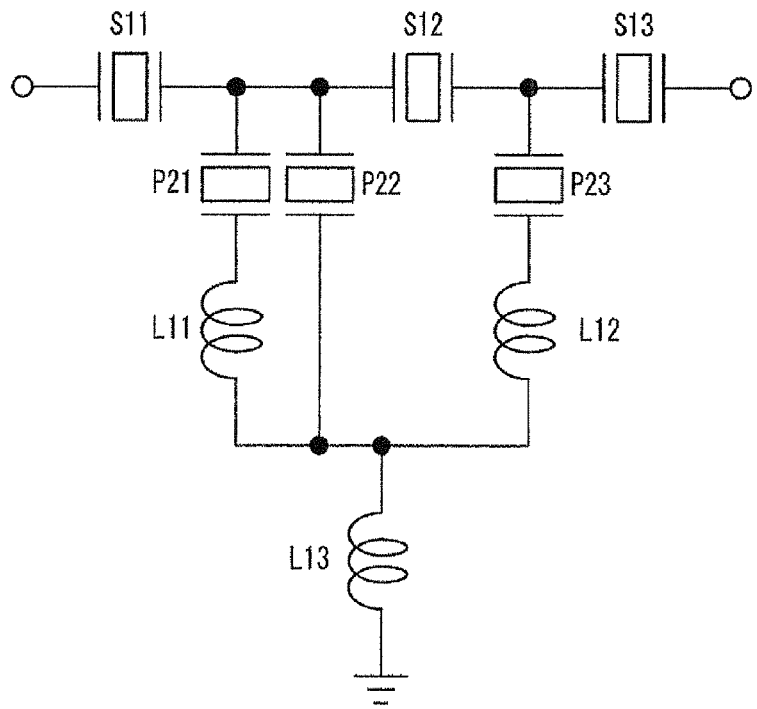
Figure 10C:
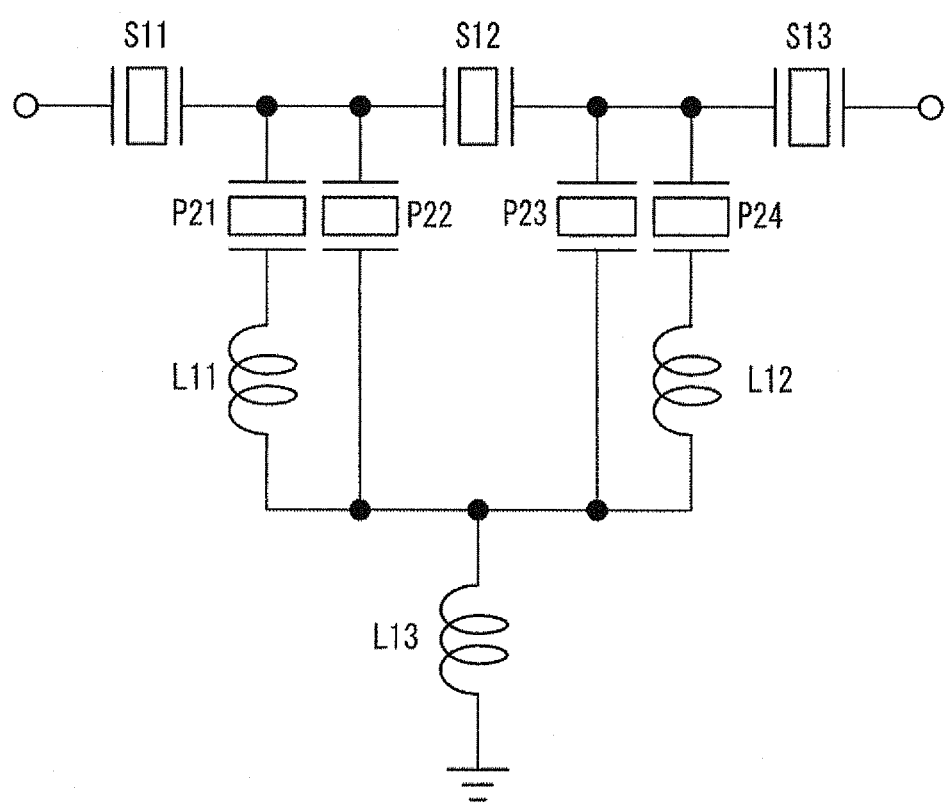

FIGS. 10A to 10C respectively illustrate modified examples of the filter according to the present embodiment. In the filter depicted in FIG. 10A an inductor L11 is connected to a parallel resonator P21, an inductor L12 is connected to a parallel resonator P22, and an inductor L13 is connected to the inductors L11 and L12 and to a parallel resonator P23. At this time, the inductance of each inductor is set such that the total inductance of the inductors L11 and L13, the total inductance of the inductors L12 and L13 and the inductance of the inductor 13 do not become equal to each other.

In the filter depicted in FIG. 10B, an inductor L11 is connected to a parallel resonator P21, an inductor L12 is connected to a parallel resonator P23, and an inductor L13 is connected to the inductors L11 and L12 and to a parallel resonator P22. At this time, the inductance of each inductor is set such that the total inductance of the inductors L11 and L13, the total inductance of the inductors L12 and L13 and the inductance of the inductor L13 do not become equal to each other.

In the filter depicted in FIG. 10C, an inductor L11 is connected to a parallel resonator P21, an inductor L12 is connected to a parallel resonator P24, and an inductor L13 is connected to the inductors L11 and L12 and to parallel resonators P22 and P23. At this time, the inductance of each inductor is set such that the total inductance of the inductors L11 and L13, the total inductance of the inductors L12 and L13 and the inductance of the inductor L13 do not become equal to each other.

Hereinafter, the filters depicted in FIGS. 6A and 10C will be compared.

Figure 11A:
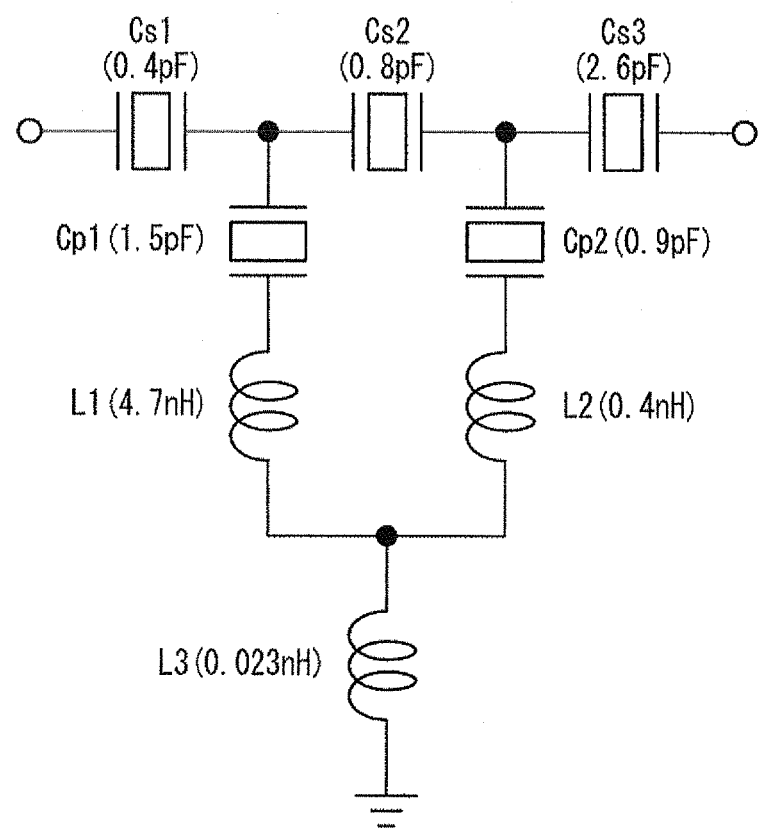
FIG. 11A is a circuit diagram illustrating the conventional filter (the filter depicted in FIG. 6A) to which a circuit constant is added.
Figure 11B:
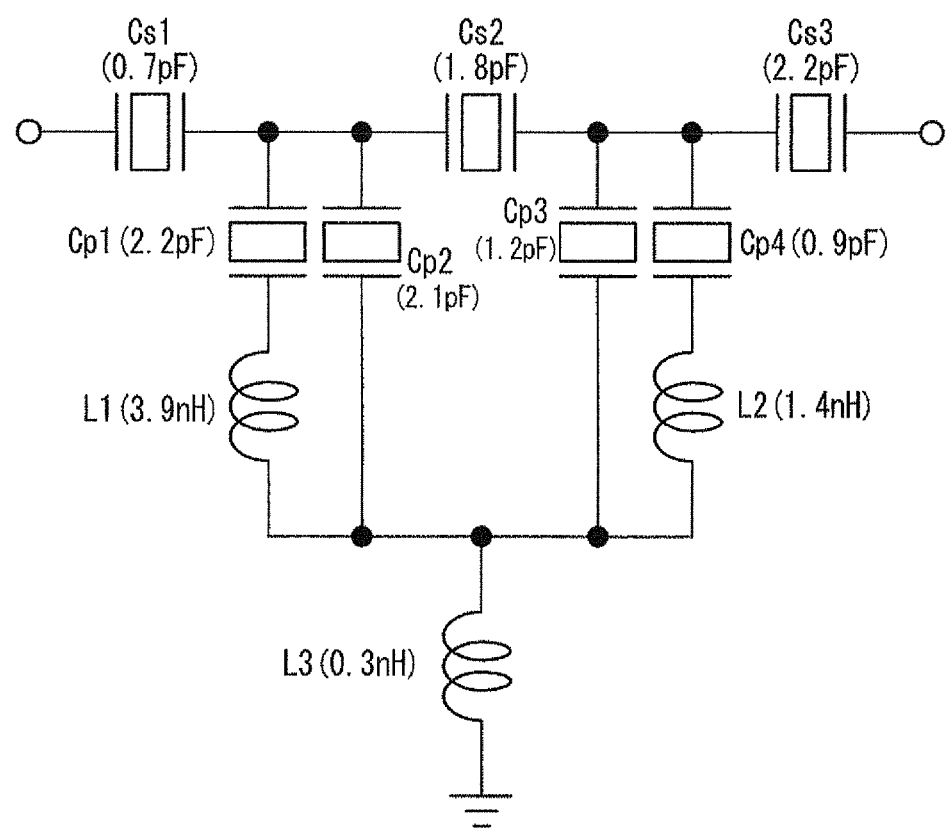
FIG. 11B is a circuit diagram illustrating the filter in one embodiment of the invention (the filter depicted in FIG. 10C) to which a circuit constant is added.

FIG. 11A is a diagram illustrating the filter in FIG. 6A with a circuit constant being added. FIG. 11B is a diagram illustrating the filter according to the present embodiment (the filter depicted in FIG. 10C) with a circuit constant being added. For example, the circuit constant in FIG. 11B is set such that required suppression becomes 25 dB at the Tx second harmonic (3760 MHz), 25 dB at the Tx third harmonic (5640 MHz) and 30 dB in the BT band (2400 to 2500 MHz).

Figure 12:
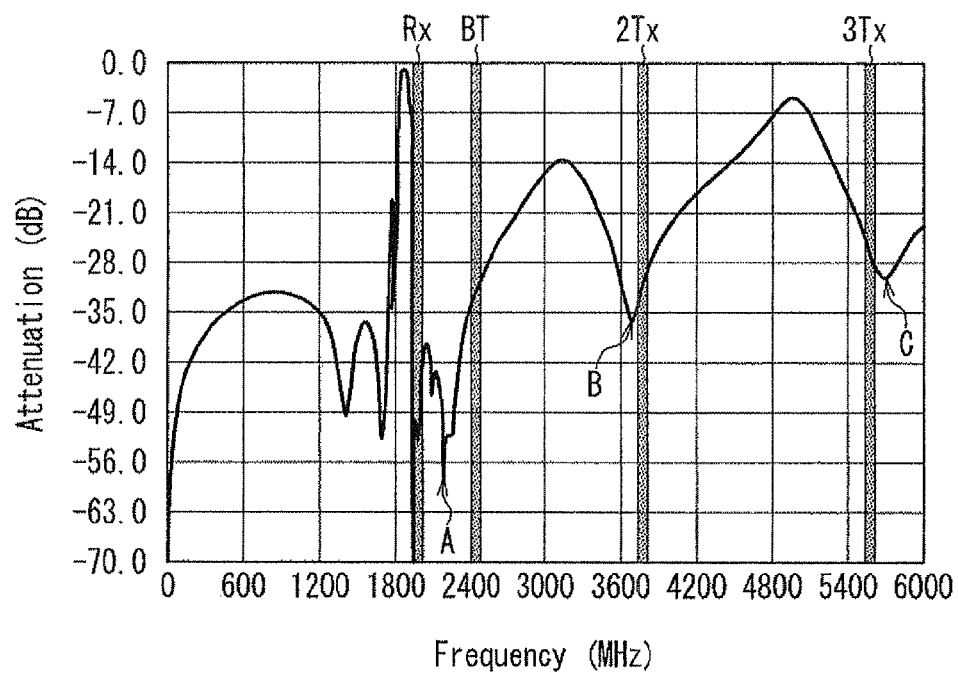
FIG. 12 is a graph illustrating the frequency characteristics of the filter depicted in FIG. 11B.

FIG. 12 is a graph illustrating the frequency characteristics of the filter with the circuit constant in FIG. 11B. As can be seen from FIG. 12, with the filter according to the present embodiment, not only that attenuation poles can be formed at three places, but also the respective attenuation poles can be placed in the frequency bands where suppression is needed. That is, an attenuation pole A can be placed near the BT band, an attenuation pole B can be placed near the Tx second harmonic band (hereinafter referred to as the 2tx band) and an attenuation pole C can be placed near the Tx third harmonic band (hereinafter referred to as the 3Tx band).

Figure 13:
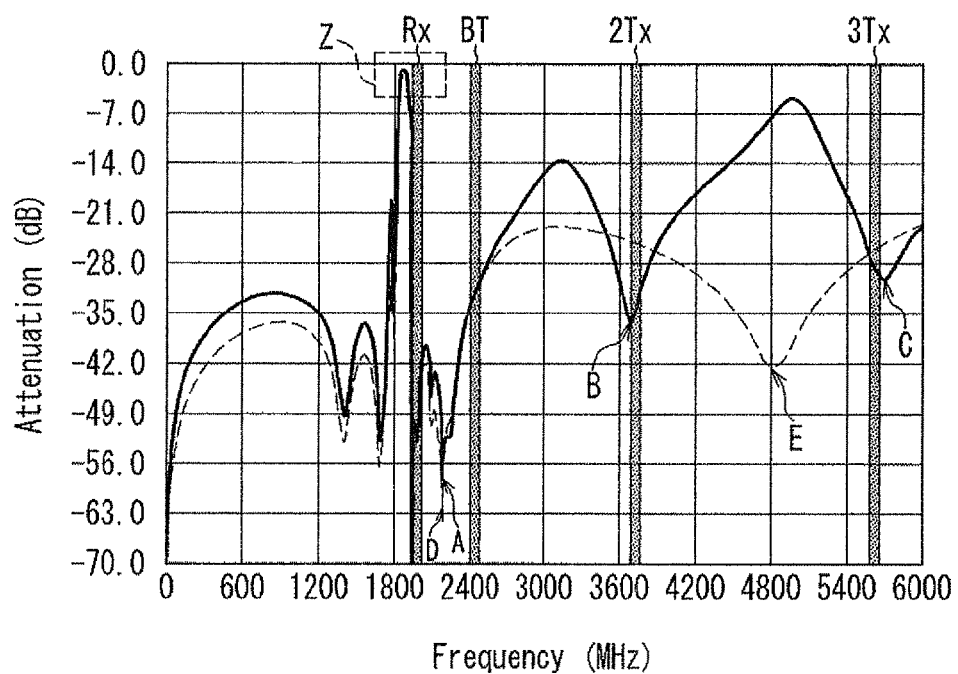
FIG. 13 is a graph illustrating the frequency characteristics in FIG. 11A and those in FIG. 12.

FIG. 13 is a graph illustrating the frequency characteristics illustrated in FIG. 12 (indicated by a solid line) and those illustrated in FIG. 11A (indicated by a dashed line). As can be seen from FIG. 13, with the filter depicted in FIG. 11A an attenuation pole D is placed between the RX band and the BT band and an attenuation pole E is placed between the 2Tx band and the 3Tx band. Therefore, sufficient suppression cannot be achieved in the BT band, the 2Tx band and the 3Tx band, where suppression is most needed. In contrast, with the filter in FIG. 11B, since the attenuation pole A is placed near the BT band, the attenuation pole B is placed near the 2Tx band and the attenuation pole C is placed near the 3Tx band, the frequency bands where suppression is most needed can be suppressed.

Figure 14A:
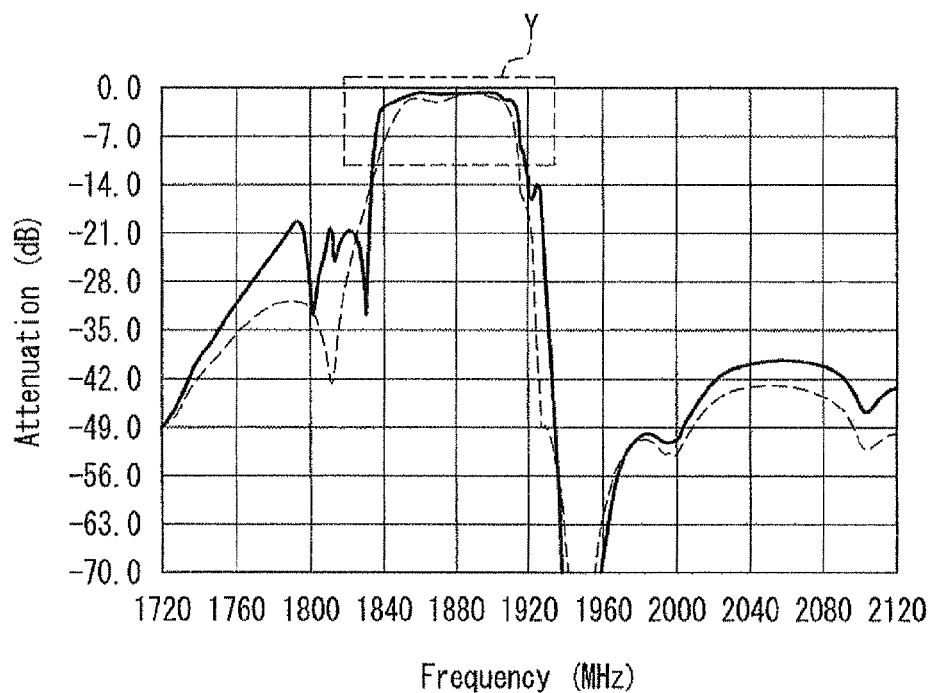
FIG. 14A is an enlarged view of the Z portion in FIG. 13.
Figure 14B:
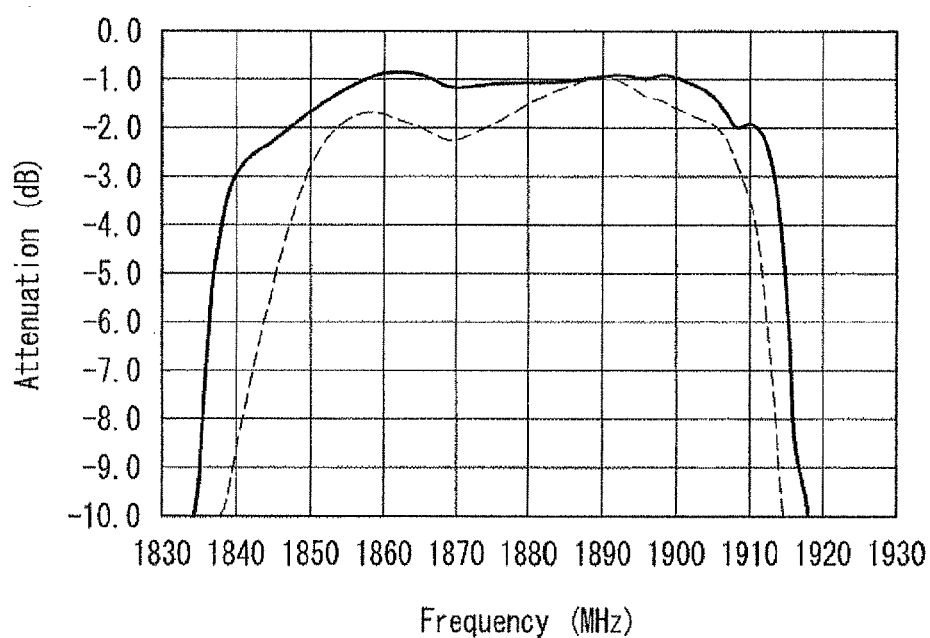
FIG. 14B is an enlarged view of the Y portion in FIG. 14A.

FIG. 14A is an enlarged view illustrating the passband (Z portion) in FIG. 13. FIG. 14B is an enlarged view illustrating the Y portion in FIG. 14A. In FIGS. 14A and 14B, the solid line indicates the frequency characteristics of the filter depicted in FIG. 11B and the dashed line indicates the frequency characteristics of the filter depicted in FIG. 11A. As can be seen from FIGS. 14A and 14B, the desired frequency bands in a high frequency band are suppressed by the attenuation poles. Thus, the attenuation of the ladder filter itself can be set to a small value. As a result, it is possible to significantly improve a loss in the passband.

Figure 15A:
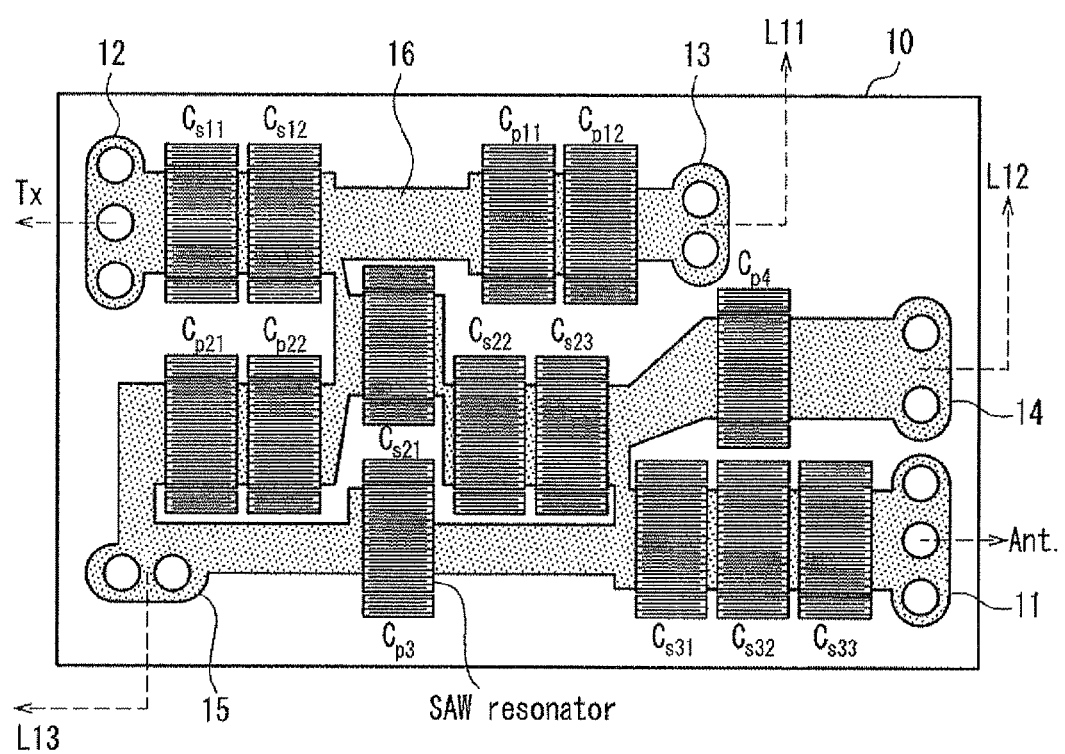
FIG. 15A is a schematic diagram illustrating an example layout of an SAW (Surface Acoustic Wave) filter chip adopting the filter in one embodiment of the invention.
Figure 15B:
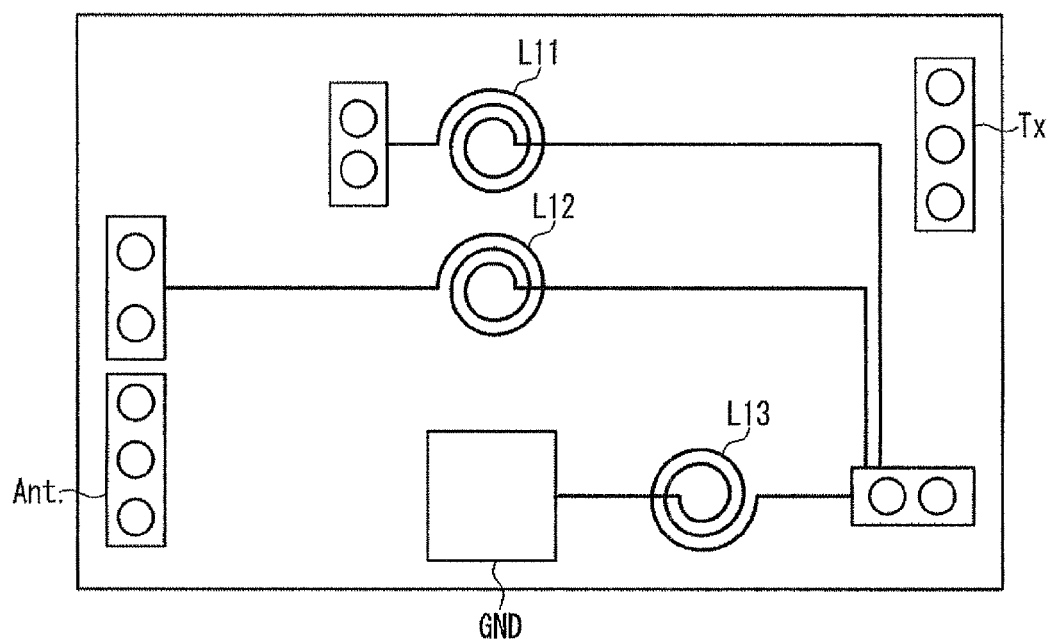
FIG. 15B is a plan view illustrating a printed wiring board on which the filter chip depicted in FIG. 15A can be mounted.

FIG. 15A is a diagram illustrating a layout example of an SAW (Surface Acoustic Wave) filter chip adopting the filter according to the present embodiment. FIG. 15B is a plan view illustrating a printed wiring board to which the surface acoustic wave filter chip depicted in FIG. 15A can be flip-bonded. The filter chip depicted in FIG. 15A is an example of chip layout of the filter depicted in FIG. 10C. The filter chip depicted in FIG. 15A is an example of a transmission filter chip mounted on a communication device or the like. In FIG. 15A, a bump electrode 11 is connected to an antenna terminal Ant depicted in FIG. 15B. A bump electrode 12 is connected to a Tx terminal depicted in FIG. 15B and is connected to a transmission circuit or a power amplifier. A bump electrode 13 is connected to an inductor L11 depicted in FIG. 15B. A bump electrode 14 is connected to an inductor L12 depicted in FIG. 15B. A bump electrode 15 is connected to an inductor L13 depicted in FIG. 15B. The bump electrodes 11 to 15 are connected to each other electrically through a conductor pattern 16. The conductor pattern 16 that connects the bump electrodes to each other includes resonators. T1he inductors L11, L12 and L13 depicted in FIG. 15B are spiral coils.

In FIG. 15A, resonators $C_{s11}$ and $C_{s12}$ correspond to the series resonator S11 in FIG. 10C. Resonators $C_{s21}$ to $C_{s23}$ correspond to the series resonator S12 in FIG. 10C. Resonators $C_{s31}$ to $C_{s33}$ correspond to the series resonator S13 in FIG. 10C. Resonators $C_{p11}$ and $C_{p12}$ correspond to the parallel resonator P21 in FIG. 10C. Resonators $C_{p21}$ and $C_{p22}$ correspond to the parallel resonator P22 in FIG. 10C. A resonator $C_{p3}$ corresponds to the parallel resonator P23 in FIG. 10C. A resonator $C_{p4}$ corresponds to the parallel resonator P24 in FIG. 10C.

Figure 16A:
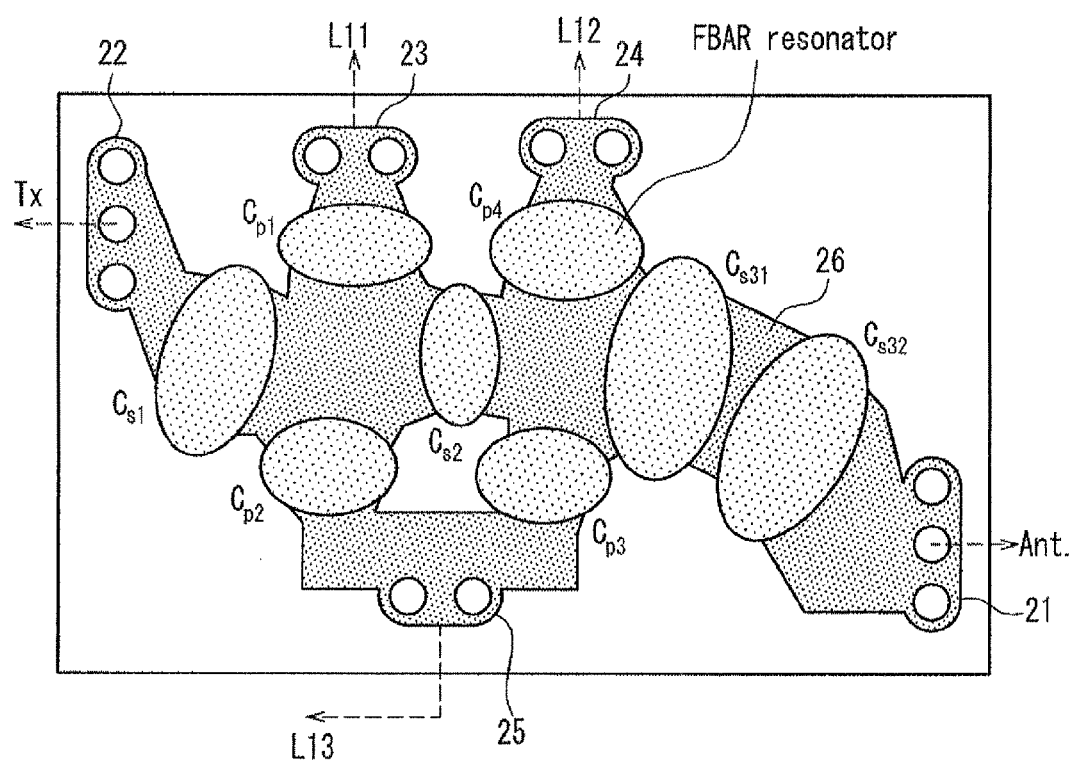
FIG. 16A is a schematic diagram illustrating an example layout of an FBAR (Film Bulk Acoustic Resonator) filter chip adopting the filter in one embodiment of the invention.
Figure 16B:
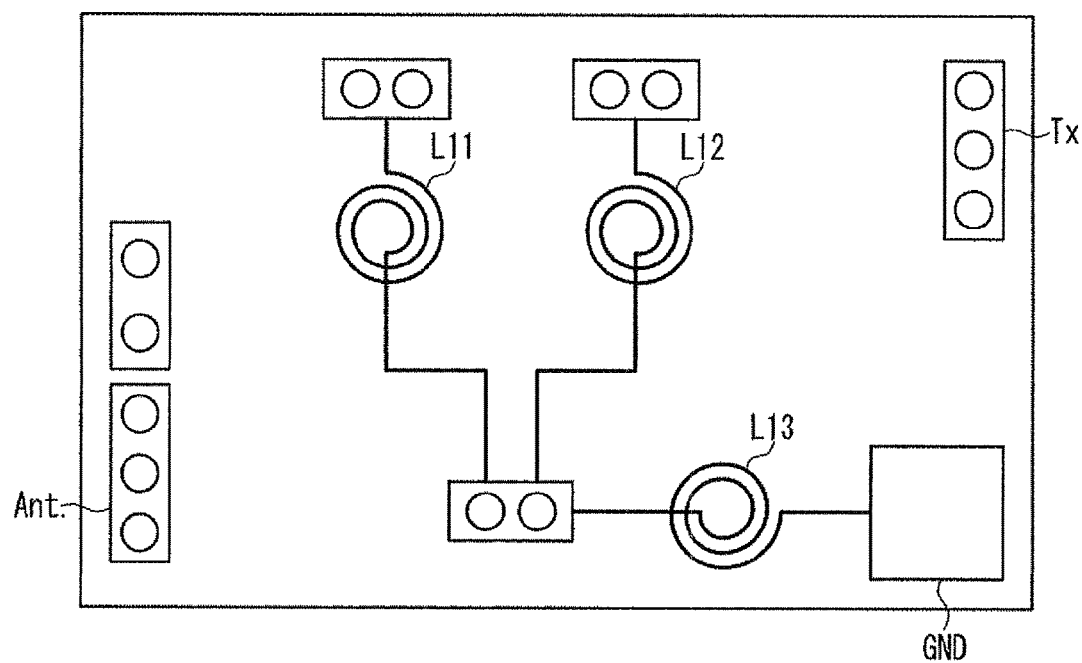
FIG. 16B is a plan view illustrating a printed wiring board on which the filter chip depicted in FIG. 16A can be mounted.

FIG. 16A is a diagram illustrating a layout example of an FBAR (film bulk acoustic resonator) filter chip adopting the filter according to the present embodiment. FIG. 16B is a plan view illustrating a printed wiring board on which the filter chip depicted in FIG. 16A can be mounted. The filter chip depicted in FIG. 16A is an example of chip layout of the filter illustrated in FIG. 10C. The filter chip depicted in FIG. 16A is an example of a transmission filter chip mounted on a communication device or the like. In FIG. 16A, a bump electrode 21 is connected to an antenna terminal Ant depicted in FIG. 16B. A bump electrode 22 is connected to a Tx terminal depicted in FIG. 16B and is connected to a transmission circuit or a power amplifier. A bump electrode 23 is connected to an inductor L11. A bump electrode 24 is connected to an inductor L12. A bump electrode 25 is connected to an inductor L13. The bump electrodes 21 to 25 are connected to each other electrically through a conductor pattern 26. The conductor pattern 26 that connects the bump electrodes to each other includes resonators. The inductors L11, L12 and L13 depicted in FIG. 16B are spiral coils.

In FIG. 16A, a resonator $C_{s1}$ corresponds to the series resonator S11 in FIG. 10C. A resonator $C_{s2}$ corresponds to the series resonator S12 in FIG. 10C. Resonators $C_{s11}$ and $C_{s12}$ correspond to the series resonator S13 in FIG. 10C. A resonator $C_{p1}$ corresponds to the parallel resonator P21 in FIG. 10C. A resonator $C_{p2}$ corresponds to the parallel resonator P22 in FIG. 10C. A resonator $C_{p3}$ corresponds to the parallel resonator P23 in FIG. 10C. A resonator $C_{p4}$ corresponds to the parallel resonator P24 in FIG. 10C.

[3. Configuration of Duplexer]

Figure 17:
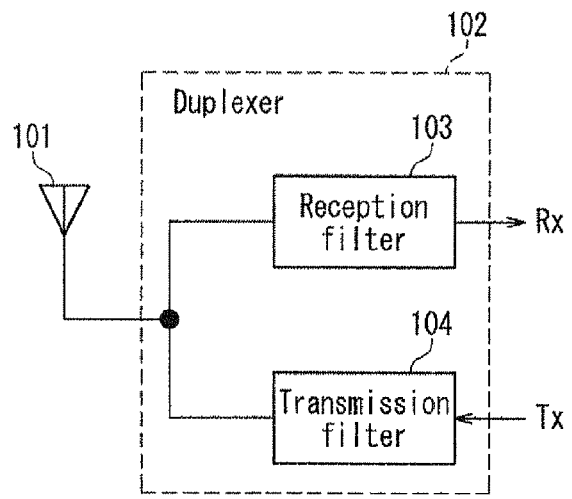
FIG. 17 is a block diagram illustrating a duplexer including the filter in one embodiment of the invention.

FIG. 17 is a block diagram illustrating a duplexer including the filter according to the present embodiment. As can be seen from FIG. 17, a duplexer 102 includes a reception filter 103 and a transmission filter 104. The duplexer 102 filters, with the reception filter 103, a reception signal inputted thereto through an antenna 101 and extracts a reception signal Rx in a desired frequency band. Further, the duplexer 102 filters an input transmission signal Tx with the transmission filter 104 and outputs the signal through the antenna 101.

The transmission filter 104 may have the circuit configuration depicted in FIGS. 8, 9, 10A, 10B or 10C. As a result, it is possible to set the transmission filter 104 to comply with the WCDMA Band II standard. As an example, the passband of the transmission filter 104 can be set to 1850 MHz to 1910 MHz. The opposite band (the passband of the reception filter) is 1930 MHz to 1990 MHz. In this case, Tx second harmonic can be set to 3760 MHz and Tx third harmonic can be set to 5640 MHz. Further, in order to prevent interference with a system that complies the Bluetooth standard, it is possible to suppress the band from 2400 to 2500 MHz.

[4. Effects of Embodiment, etc.]

According to the present embodiment, by connecting inductors having different inductances from each other to parallel resonators in a ladder filter, the number of attenuation poles can be increased without significantly increasing the number of stages in the filter. Furthermore, since the attenuation poles can be placed in desired frequency bands, a filter that can suppress the desired frequency bands can be achieved. Moreover, suppression in the passband can be reduced.

In order to clarify the comparison, the capacity ratio of all of the resonators used in the filter in the present embodiment has been fixed to "16", assuming the case of a surface acoustic wave device. Further, all of the resonance frequencies of the plurality of series resonators included the filter are set to the same frequency. Further, all of the resonance frequencies of the plurality of parallel resonators included the filter are set to the same frequency. It should be noted that when actually designing a circuit on the basis of the filter according to the present embodiment, the capacity ratio and the resonance frequency of each resonator may be set arbitrarily.

Although the surface acoustic wave device has been described in the present embodiment as an example of implementing the filer, the filter can be applied also to an FBAR filter, an SMR (solid mounted resonator) filter and other types of ceramic filters.

The filter according to the present embodiment can be applied not only to a duplexer, but also to an RF module such as a duplexer bank module formed by integrating a plurality of duplexers as a module or a duplexer amplifier module formed by integrating an amplifier and a duplexer as a module.

Figure 18:
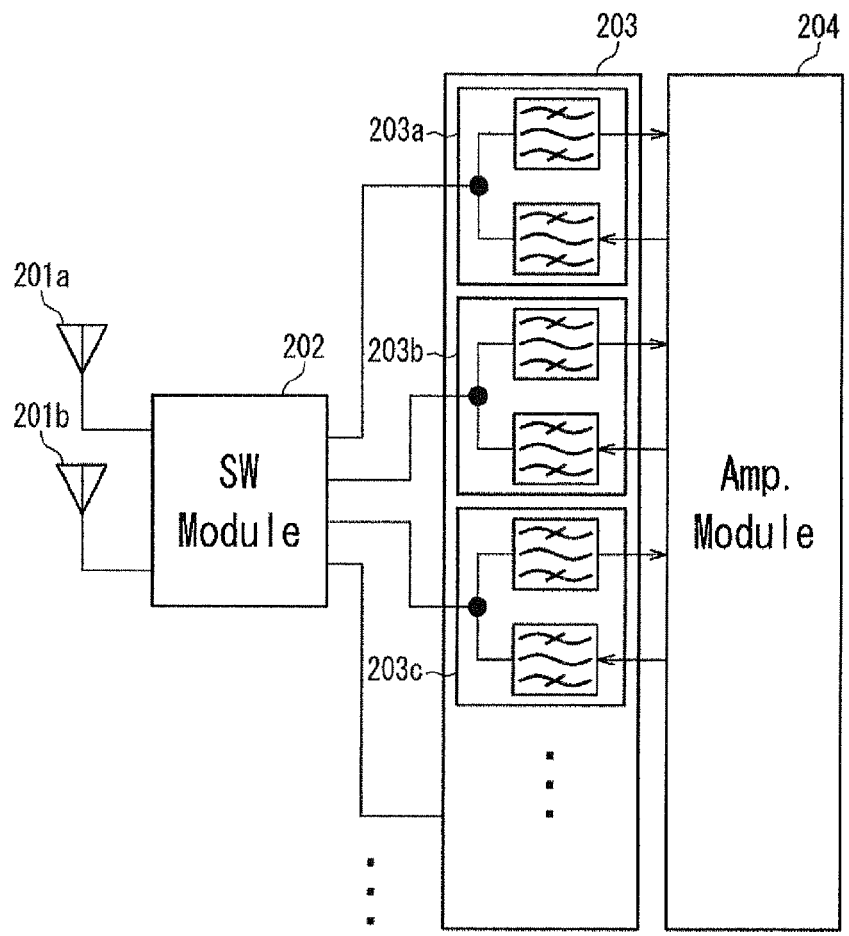
FIG. 18 is a block diagram illustrating an RF module.

FIG. 18 is a block diagram illustrating an RF module including a duplexer bank module. As can be seen from FIG. 18, the RF module includes a switch module 202, a duplexer bank module 203 and an amplifier module 204. The switch module 202 is connected to antennas 201a and 201b and to duplexers in the duplexer bank module 203. The duplexer bank module 203 includes a plurality of duplexers 203a, 203b, 203c . . . . The filter according to the present embodiment can be used as a reception filter and/or a transmission filter in each of the duplexers 203a, 203b, 203c . . . in the duplexer bank module 203.

Figure 19:
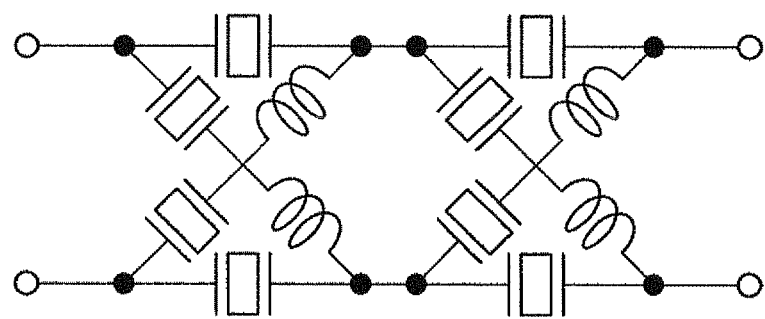
FIG. 19 is a circuit diagram illustrating a lattice filter.

Although the ladder filter has been described in the present embodiment as an example of the filter, similar effects can be achieved by a lattice filter depicted in FIG. 19 in which resonators are connected in a lattice shape. The lattice filter includes two signal lines and tie lines connected between the signal lines. Series resonators are connected to the signal lines and parallel resonators are connected to the tie lines. At least two of the parallel resonators are connected between the signal lines in parallel. By connecting inductors to the two parallel resonators in series and implementing the inductors using elements having different inductances from each other, effects similar to those of the present embodiment can be achieved.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the sprit and scope of the invention.

The invention claimed is:

1. A filter comprising a plurality of series resonators connected to a signal line in series and a plurality of parallel resonators connected to the signal line in parallel,
   wherein at least two parallel resonators that are adjacent to each other among the plurality of parallel resonators are connected to the signal line between two adjacent ones of the plurality of series resonators in parallel,
   inductors are respectively connected to the at least two parallel resonators in series, said inductors being not shared with any other parallel resonators other than the at least two parallel resonators to which the inductors are respectively connected, and
   the inductors have different inductances from each other.

2. The filter according to claim 1, wherein the plurality of series resonators and the plurality of parallel resonators are connected to each other in a ladder shape.

3. The filter according to claim 2, wherein the plurality of parallel resonators including the at least two parallel resonators to which the inductors having different inductances from each other are respectively connected are grounded through one common inductor.

4. The filter according to claim 1, wherein the plurality of series resonators and the plurality of parallel resonators are connected to each other in a lattice shape.

5. The filter according to claim 1, wherein the plurality of parallel resonators including the at least two parallel resonators to which the inductors having different inductances from each other are respectively connected are grounded through one common inductor.

6. The filter according to claim 5, wherein the common inductor is incorporated in a package or a printed wiring board.

7. The filter according to claim 1, wherein at least one of the series resonator and the parallel resonator is a surface acoustic wave element.

8. The filter according to claim 1, wherein at least one of the series resonator and the parallel resonator is a film bulk acoustic resonator.

9. The filter according to claim 1, wherein at least one of the series resonator and the parallel resonator is a bulk wave element.

10. A duplexer comprising a transmission filter and a reception filter,
    wherein at least one of the transmission filter and the reception filter includes a plurality of series resonators connected to a signal line in series and a plurality of parallel resonators connected to the signal line in parallel,
    wherein at least two parallel resonators that are adjacent to each other among the plurality of parallel resonators are connected to the signal line between two adjacent ones of the plurality of series resonators in parallel,
    inductors are respectively connected to the at least two parallel resonators in series, said inductors being not shared with any other parallel resonators other than the at least two parallel resonators to which the inductors are respectively connected, and
    the inductors have different inductances from each other.

11. A communication module comprising a transmission filter and a reception filter,
    wherein at least one of the transmission filter and the reception filter includes a plurality of series resonators connected to a signal line in series and a plurality of parallel resonators connected to the signal line in parallel,
    wherein at least two parallel resonators that are adjacent to each other among the plurality parallel resonators are connected to the signal line between two adjacent ones of the plurality of series resonators in parallel, inductors are respectively connected to the at least two parallel resonators in series, said inductors being not shared with any other parallel resonators other than the at least two parallel resonators to which the inductors are respectively connected, and the inductors have different inductances from each other.

\* \* \* \* \*